United States Patent [19]

Nakamura et al.

[11] Patent Number: 4,591,545
[45] Date of Patent: May 27, 1986

[54] PHOTOSENSITIVE IMAGE-FORMING MATERIAL HAVING A LAYER OF PHOTOSENSITIVE POLYESTER MODIFIED WITH CHAIN EXTENDER

[75] Inventors: Chiaki Nakamura, Tokyo; Kouji Oe; Tomonobu Muta, both of Urawa; Toshiki Sasaki, Kamifukuoka, all of Japan

[73] Assignee: Dainippon Ink and Chemicals, Inc., Tokyo, Japan

[21] Appl. No.: 574,573

[22] Filed: Jan. 27, 1984

[30] Foreign Application Priority Data

May 10, 1983 [JP] Japan .................................. 58-81282
Aug. 4, 1983 [JP] Japan .................................. 58-142782
Sep. 8, 1983 [JP] Japan .................................. 58-164149
Oct. 21, 1983 [JP] Japan .................................. 58-196137

[51] Int. Cl.$^4$ .......................... G03C 1/70; G03C 1/68; C08G 18/06
[52] U.S. Cl. .................................... 430/284; 430/285; 528/45; 528/75; 528/296; 528/26; 521/104
[58] Field of Search .............................. 430/285, 284; 204/159.19; 528/45, 75, 308, 296, 26

[56] References Cited

U.S. PATENT DOCUMENTS

| T892,006 | 11/1971 | Laakso et al. | 430/285 |
|---|---|---|---|
| 2,956,878 | 10/1960 | Michiels et al. | 430/285 X |
| 3,655,625 | 4/1972 | Thomas | 528/75 X |
| 3,677,920 | 7/1972 | Kai et al. | 430/285 |
| 3,726,685 | 4/1973 | Phlipot et al. | 430/285 X |
| 3,873,505 | 3/1975 | Laakso et al. | 430/285 X |
| 4,258,124 | 5/1981 | Shimizu et al. | 430/285 |

*Primary Examiner*—John E. Kittle
*Assistant Examiner*—Cynthia Hamilton
*Attorney, Agent, or Firm*—Sherman and Shalloway

[57] ABSTRACT

A photosensitive image-forming material having a photosensitive layer, said photosensitive layer comprising a photosensitive resin resulting from the reaction of a hydroxyl-containing polyester precursor composed of dicarboxylic acid units derived from a dicarboxylic acid having a photosensitive unsaturated double bond adjacent to an aromatic ring and glycol units with a chain extender having in the molecule at least two functional groups capable of reacting with the hydroxyl groups of the polyester precursor.

14 Claims, No Drawings

PHOTOSENSITIVE IMAGE-FORMING MATERIAL HAVING A LAYER OF PHOTOSENSITIVE POLYESTER MODIFIED WITH CHAIN EXTENDER

This invention relates to a photosensitive image-forming material having improved photosensitivity.

Since the cinnamoyl moiety of the formula

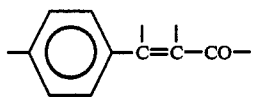

performs a unique photodimerization reaction, investigations have been made heretofore on the preparation of image-forming materials using various photosensitive resins having the cinnamoyl moiety introduced into the side chain or main chain of the macromolecules. For example, poly(vinyl alcohol), polyepichlorohydrin, polystyrene, acrylic resins and epoxy resins having the cinnamoyl moiety at the side chain and polyesters and polyamides having the cinnamoyl moiety in the main chain are known, and some of them have come into commercial acceptance. For example, poly(vinylcinnamate) produced by the reaction of poly(vinyl alcohol) with cinnamoyl chloride and a polyester produced by the condensation of diethyl phenylenediacrylate with 1,4-di-(β-hydroxyethoxy)cyclohexane are utilized as image-forming materials such as printing plates and LSI elements.

It is said that photosensitive polyester resins having the cinnamoyl moiety in the main chain of the macromolecule produced by the condensation of phenylenediacrylic acid or its alkyl esters with glycols have relatively high photosensitivity among the above-exemplified photodimerizable photosensitive resins. However, their photosensitivity is not entirely sufficient for the present-day practical requirements. On the other hand, attempts have been made to increase the photosensitivity of image-forming materials prepared by using the aforesaid photosensitive polyester by using polyfunctional cinnamic acid esters as crosslinking agents. These cross-linking agents, however, generally have poor compatibility with resins, and their ability to increase the sensitivity of the photosensitive polyester resins is insufficient.

A simplified plate-making method has recently been proposed which comprises directly writing an image on a photosensitive layer from electrical image signals using laser beams instead of exposing an image through a halftone film. The insufficient photosensitivity of presently available photosensitive image-forming materials makes it necessary to use large-scale laser devices of high output. Accordingly, it has been desired to develop photosensitive image-forming materials having higher sensitivity.

It is known that photosensitive resins used for making image-forming materials are produced by the polycondensation reaction of polycarboxylic acids having the cinnamoyl moiety with polyhydric alcohols, and the photosensitivity of these resins increases as their molecular weight increases. In a polycondensation reaction, however, it is generally difficult to obtain polymers having a high molecular weight. When the polycondensation reaction is carried out at high temperatures over long periods of time in order to increase the molecular weights of the resulting polymers, branching and crosslinking tend to occur as side-reactions owing to the presence of the cinnamoyl moiety and a gel insoluble in solvent tends to form. These facts or phenomena adversely affect the developability, resolving power, printing properties, etc. of image-forming materials made from the resulting resins.

It is an object of this invention to increase the photosensitivity of a photosensitive image-forming material prepared by using a photosensitive resin having a cinnamoyl moiety.

The present inventors made extensive investigations in order to obtain such an image-forming material having increased photosensitivity, and have found that an image-forming material prepared by using as a film-forming resin of a photosensitive layer a resin having a high molecular weight obtained by using a chain extender during polycondensation has very high photosensitivity and good developability, resolving power and printing properties and can achieve the aforesaid object of this invention.

Thus, according to this invention, there is provided a photosensitive image-forming material having a photosensitive layer, said photosensitive layer comprising a photosensitive resin resulting from the reaction of a hydroxyl-containing polyester precursor composed of dicarboxylic acid units derived from a dicarboxylic acid having a photosensitive unsaturated double bond adjacent to an aromatic ring and glycol units with a chain extender having in the molecule at least two functional groups capable of reacting with the hydroxyl groups of the polyester precursor.

Examples of the dicarboxylic acid units derived from the photosensitive unsaturated dicarboxylic acid are those of the following general formulae (1) to (7). These units can be derived from the corresponding dicarboxylic acids or their derivatives, for example the dialkyl esters (e.g., dimethyl or diethyl esters) thereof, and the di(alkylene-glycol) esters thereof such as their di(ethylene glycol) esters or di(propylene glycol) esters.

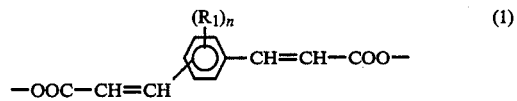 (1)

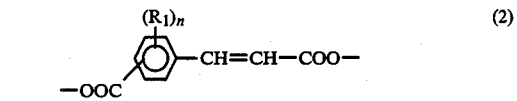 (2)

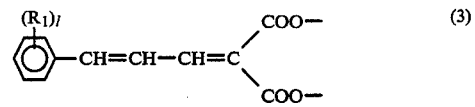 (3)

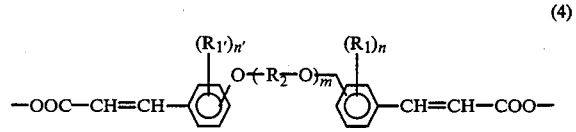 (4)

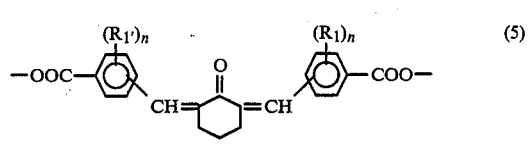 (5)

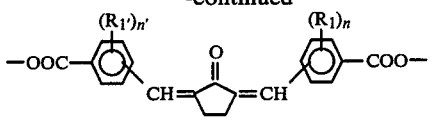 (6)

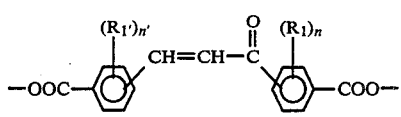 (7)

In the above general formulae (1) to (7), $R_1$ and $R'_{1'}$ independently from each other, represent a hydrogen atom, an alkyl group having 1 to 4 carbon atoms, an alkoxy group having 1 to 4 carbon atoms, a halogen atom, or a nitro group; $R_2$ represents an alkylene group having 2 to 4 carbon atoms; l represents an integer of 1 to 5; n represents an integer of 1 to 4; and m represents an integer of 1 to 5.

Specific examples of the photosensitive unsaturated dicarboxylic acids or their derivatives from which the aforesaid dicarboxylic acid units can be derived include p-phenylenediacrylic acid, m-phenylenediacrylic acid, 2,5-dimethoxy-p-phenylene-diacrylic acid, 2-nitro-p-phenylenediacrylic acid, p-carboxycinnamic acid, cinnamylidenemalonic acid, bis(p-cinnamic acid)diethylene glycol ether, bis(p-carboxybenzal)cyclohexanone, bis(p-carboxybenzal)cyclopentanone and p,p'-chalconedicarboxylic acid. In the production of the polyester precursor, the aforesaid photosensitive unsaturated dicarboxylic acids or their derivatives may be used together with other dicarboxylic acids or their derivatives. Specific examples of the other dicarboxylic acids or their derivatives include succinic acid, adipic acid, azelaic acid, sebacic acid, phthalic acid, isophthalic acid, terephthalic acid, tetrahydrophthalic acid, hexahydrophthalic acid, tetrabromophthalic acid, tetrachlorophthalic acid, maleic acid, fumaric acid, itaconic acid and 5-sodiumsulfoisophthalic acid, and their anhydrides or esters.

The other dicarboxylic acids or their derivatives should not be used in too large amounts because too large amounts rather cause a reduction in photosensitivity of the resulting resins. To obtain sufficiently high photosensitivity, the amount of the dicarboxylic acid units derived from the photosensitive unsaturated dicarboxylic acid is desirably in the range of 30 to 100 mole % based on the total amount of the dicarboxylic acid units.

Various glycol components can be used without any particular restriction. They include, for example, ethylene glycol, diethylene glycol, triethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-(β-hydroxyethoxy)cyclohexane, cyclohexane dimethanol, tricyclodecane dimethanol, hydrogenated bisphenol A, hydrogenated bisphenol F, an ethylene oxide adduct of bisphenol A, a propylene oxide adduct of bisphenol A, an ethylene oxide adduct of bisphenol F, and a propylene oxide adduct of bisphenol F.

In the synthesis of the hydroxyl-containing polyester precursor composed of the dicarboxylic acid units derived from the photosensitive unsaturated dicarboxylic acid and the glycol units, the proportions of the starting materials are desirably selected such that at least one equivalent, preferably 1.1 to 2.0 equivalents, of the hydroxyl groups derived from the glycol exist per equivalent of groups (carboxylic acid groups or carboxylate groups) derived from the dicarboxylic acid, in order to introduce hydroxyl groups into both ends of the molecule of the polyester precursor.

The polyester precursor can be produced easily by usual procedures known in the field of synthesizing polyesters, for example by the method described in U.S. Pat. No. 3,622,320. Specifically, it can be produced by reacting (esterification or transesterification reaction) the dicarboxylic acid component and the glycol component in the optional presence of a catalyst and an inhibitor, and thereafter gradually reducing the pressure in the inside of the reactor to distill out the excess of the glycol. Preferably, the reaction temperature is in the range of 150° to 250° C., and the pressure is reduced to 3 mmHg or lower.

Examples of the catalyst optionally used in the production of the polyester precursor are organic metal compounds such as dibutyltin oxide, dibutyltin dilaurate, dibutyltin diacetate, lithium ethoxide, tetraisopropyl titanate and tetrabutyl titanate; and inorganic metal compounds such as titanium dioxide, zinc acetate, antimony trioxide and calcium oxide. The amount of the catalyst used is preferably in the range of 50 to 10,000 ppm as the metal.

The inhibitor is used as required in order to minimize the crosslinking and/or branching of the ethylenically unsaturated group which tend to occur concurrently with the polycondensation reaction. Examples are phenothiazine, hydroquinone, hydroquinone monomethyl ether, 2,6-di-tert-butyl-p-cresol, and p-benzoquinone. Its amount is preferably in the range of 50 to 2,000 ppm.

The polyester precursor preferably has a weight average molecular weight of at least 7,000, and more preferably 10,000. A resin having a high molecular weight can be produced by reacting the polyester precursor having a molecular weight in the above-specified range with the chain extender to be described below. From the resulting resin, an image-forming material having increased photosensitivity can be produced.

The chain extender capable of reacting with the hydroxyl groups of the polyester precursor includes, for example, compounds having a functional group such as aryl ester, aryl carbonate, N-acyllactam, N-acylimide, acid anhydride, benzoxazinone, isocyanate, blocked isocyanate, oxazolonyl, N-acylimidazole, silanol, furoxane, aziridine, isothiocyanate, vinyl ether, ketene acetal, unsaturated cycloacetal, and carbodiimide groups.

Examples of the compounds having such functional groups are diaryl oxalate compounds, diaryl phthalate compounds, diaryl carbonate compounds, bis(N-acyllactam) compounds, bis(N-acylimide) compounds, tetracarboxylic dianhydrides, bisbenzoxazinone compounds, polyisocyanate compounds, bis-oxazolone compounds, bis(N-acylimidazole) compounds, alkoxysilane compounds, silanol compounds, furoxane compounds, bis-aziridine compounds, polyisothiocyanate compounds, divinyl ether compounds, diketene acetal compounds, unsaturated cycloacetal compounds, and biscarbodiimide compounds. Specific examples of these compounds are cited below.

Compounds represented by the following general formula (8), (9) and (10) may be cited as examples of the diaryl oxalate compounds, diaryl phthalate compounds and diaryl carbonate compounds, respectively.

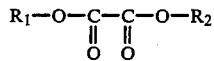 (8)

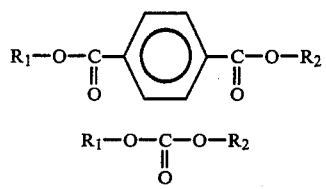 (9)

(10)

In general formulae (8) to (10), $R_1$ and $R_2$, independently from each other, represent an aromatic hydrocarbon group which may have a substituent, for example,

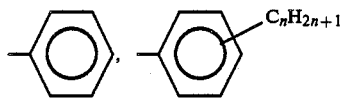

(n is an integer of 1 to 10),

(X is a halogen atom), and

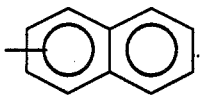

Compounds of general formula (11) are cited as examples of the bis(N-acyllactam) compounds, and compounds of general formula (12), as examples of the bis(N-acylimide) compounds.

(11)

(12)

In general formula (11) and (12), $R_1$ represents an organic group having 2 to 12 carbon atoms, and $R_2$ and $R_3$, independently from each other, represent an aliphatic or aromatic hydrocarbon group.

Examples of preferred bis(N-acyllactam) compounds and bis(N-acylimide) compounds include terephthaloyl bis(N-caprolactam), isophthaloyl bis(N-caprolactam), adipoyl bis(N-caprolactam), azelaoyl bis(N-caprolactam), sebacoyl bis(N-caprolactam), terephthaloyl bis(N-pyrrolidone), isophthaloyl bis(N-pyrrolidone), adipoyl bis(N-succinimide), sebacoyl bis(N-succinimide), isophthaloyl bis(N-succinimide) and sebacoyl bis(N-phthalimide).

Examples of the tetracarboxylic dianhydride are those of the following general formula

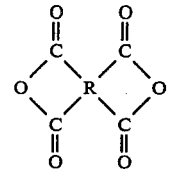 (13)

In general formula (13), R represents a tetravalent organic group having at least two carbon atoms.

Specific examples of the tetracarboxylic dianhydride of general formula (13) include aromatic tetracarboxylic dianhydrides such as pyromellitic dianhydride, 3,3',4,4'-benzophenonetetracarboxylic dianhydride, 3,3',4,4'-diphenyltetracarboxylic dianhydride, 2,3,6,7-naphthalenetetracarboxylic dianhydride, 1,4,5,8-naphthalenetetracarboxylic dianhydride, 4,4'-sulfonyldiphthalic dianhydride, 2,2-bis(3,4-dicarboxyphenyl)propane dianhydride, bis(3,4-dicarboxyphenyl)ether dianhydride, 4,4'-[3,3'-(alkylphoryldiphenylene)-bis-(iminocarbonyl)]-diphthalic dianhydrides, an adduct between hydroquinone diacetate and trimellitic anhydride; and aliphatic tetracarboxylic dianhydrides such as 5-(2,5-dioxotetrahydrofuryl)-3-methyl-3-cyclohexene-1,2-dicarboxylic anhydride (Epiclon B-4400, a tradename for a product of Dainippon Ink and Chemical, Inc.), butane-1,2,3,4-tetracarboxylic dianhydride and cyclopentanetetracarboxylic dianhydride.

Examples of the bisbenzoxazinone compounds are those of the general formula (14)

In general formula (14), $R_1$ represents a tetravalent aromatic group, and $R_2$ and $R_3$, independently from each other, represent an alkyl, aryl or cycloalkyl group.

Examples of preferred compounds of general formula (14) are 2,8-dimethyl-4H,6H-benzo[1,2-d:5,4-d']bis-[1,3]-oxazine-4,6-dione, 2,7-dimethyl-4H,9H-benzo-[1,2-d:4,5-d']bis[1,3]-oxazine-4,9-dione, 2,8-diphenyl-4H,6H-benzo[1,2-d:5,4-d']bis[1,3]-oxazine-4,6-dione, 2,7-diphenyl-4H,9H-benzo[1,2-d:4,5-d']bis[1,3]-oxazine-4,9-dione, 6,6'-bis(2-methyl-4H,3,1-benzoxazin-4-one), 6,6'-bis(2-ethyl-4H,3,1-benzoxazin-4-one), 6,6'-bis(2-phenyl-4H,3,1-benzoxazin-4-one), 6,6'-methylenebis(2-methyl-4H,3,1-benzoxazin-4-one), 6,6'-methylenebis(2-phenyl-4H,3,1-benzoxazin-4-one), 6,6'-ethylenebis(2-methyl-4H,3,1-benzoxazin-4-one), 6,6'-ethylenebis(2-phenyl-4H,3,1-benzoxazin-4-one), 6,6'-butylenebis(2-methyl-4H,3,1-benzoxazin-4-one), 6,6'-butylenebis(2-phenyl-4H,3,1-benzoxazin-4-one), 6,6'-hydroxybis(2-methyl-4H,3,1-benzoxazin-4-one), 6,6'-hydroxybis(2-phenyl-4H,3,1-benzoxazin-4-one), 6,6'-sulfonylbis(2-methyl-4H,3,1-benzoxazin-4-one), 6,6'-sulfonylbis(2-phenyl-4H,3,1-benzoxazin-4-one), 6,6'-carbonylbis(2-methyl-4H,3,1-benzoxazin-4-one), 6,6'-carbonylbis(2- phenyl-4H,3,1-benzoxazin-4-one), 7,7'-methylenebis(2-methyl-4H,3,1-benzoxazin-4-one), 7,7'-methylenebis(2-phenyl-4H,3,1-benzoxazin-4-one), 7,7'-bis(2-methyl-4H,3,1-benzoxazin-4-one), 7,7'-ethylenebis(2-methyl-4H,3,1-benzoxazin-4-one), 7,7'-ethylenebis(2-methyl-4H,3,1-benzoxazin-4-one), 7,7'-hydroxybis(2-methyl-4H,3,1-benzoxazin-4-one), 7,7'-sulfonylbis(2-methyl-4H,3,1-benzoxazin-4-one), and 7,7'-carbonylbis(2-methyl-4H,3,1-benzoxazin-4-one).

Examples of suitable polyisocyanate compounds include aromatic diisocyanate compounds such as 2,4-tolylene diisocyanate, 2,6-tolylene diisocyanate, xylylene diisocyanate, m-xylylene diisocyanate, 4,4'-diphenylmethane diisocyanate and naphthylene diisocyanate; aliphatic diisocyanate compounds such as hexamethylene diisocyanate, trimethylhexamethylene diisocyanate, lysine diisocyanate and dimeric acid diisocyanate; alicyclic diisocyanate compounds such as isophorone diisocyanate, 4,4'-methylenebis-(cyclohexyl isocyanate), methylcyclohexane-2,4-(or 2,6)diisocyanate, and 1,3-(isocyanate methyl)cyclohexane; reaction products of polyols and diisocyanates, such as an adduct of 1 mole of 1,3-butylene glycol and 2 moles of tolylene diisocyanate, and an adduct of 1 mole of trimethylolpropane and 3 moles of tolylene diisocyanate; diisocyanate polymers such as hexamethylene diisocyanate trimer and tolylene diisocyanate trimer; and blocked polyisocyanate compounds obtained by reacting the above-exemplified polyisocyanate compounds with blocking agents (for example, alcohols such as methanol, ethanol and propanol, phenols such as phenol, m-cresol and m-nitrophenol, lactams such as ε-caprolactam and 2-pyrrolidone, oximes such as acetone oxime and methyl ethyl ketone oxime, and active methylene compounds such as malonic acid esters and acetoacetic acid esters).

Examples of the bisoxazolone compound are those of the following general formula

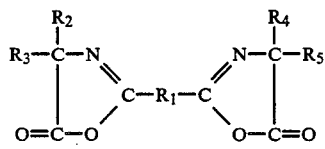

(16)

In general formula (16), $R_1$ represents an aliphatic or aromatic hydrocarbon group, and $R_2$, $R_3$, $R_4$ and $R_5$, independently from each other, represent a hydrogen atom or an aliphatic or aromatic hydrocarbon group.

Examples of preferred compounds of general formula (16) include 2,2'-p-phenylenebis[(4H)oxazolone-5], 2,2'-m-phenylenebis[(4H)oxazolone-5], 2,2'-p-phenylenebis[4-methyl(4H)oxazolone-5], 2,2'-m-phenylenebis[4-methyl(4H)-oxazolone-5], 1,4-bis-2[4-methyl(4H)-5-oxazolonyl]cyclohexane, 1,2-bis-2[4-methyl(4H)-5-oxazolonyl]cyclohexane, 2,2'-tetramethylenebis[(4H)oxazolone-5], 2,2'-tetramethylenebis[4,4-dimethyl-(4H)oxazolone-5] and 2,2'-dimethylenebis[4,4-dimethyl-(4H)oxazolone-5].

The reaction of the polyester precursor with the chain extender is carried out by (a) adding a predetermined amount of the chain extender in a solution of the polyester precursor in an organic solvent, or (b) adding a predetermined amount of the chain extender to a molten mass of the polyester precursor. Preferred reaction conditions naturally differ depending upon the reactivity of the chain extender, the presence or absence of the catalyst, etc. Generally, the reaction temperature may be in the range of 50° to 250° C., and the reaction pressure, atmospheric pressure or reduced pressure.

The ratio of the chain extender to be reacted to the polyester precursor is desirably selected such that there are 0.2 to 1.5 equivalents, preferably 0.5 to 1.2 equivalents, of the functional groups of the chain extender capable of reacting with the hydroxyl groups of the polyester precursor per equivalent of the aforesaid hydroxyl groups. If the proportion of the functional groups of the chain extender to the aforesaid hydroxyl group is less than 0.2 equivalent, it is difficult to increase the molecular weight of the resulting resin to a point required for obtaining high photosensitivity. On the other hand, the use of the chain extender in a proportion exceeding 1.5 equivalents as the functional group cannot further increase the molecular weight and photosensitivity of the resulting resin, and rather tends to cause gellation.

As required, a catalyst may be used in the reaction of the polyester precursor with the chain extender. Examples of such a catalyst are organic metal compounds such as dibutyltin oxide, dibutyltin dilaurate, and tetra-n-butyl titanate, etc.; tertiary amines such as dimethylbenzylamine and quaternary ammonium salts such as trimethyl benzyl ammonium chloride.

Examples of suitable organic solvents for use in the above reaction include chlorine-containing solvents such as methylene chloride, chloroform, trichloroethane, trichloroethylene, monochlorobenzene, dichlorobenzene and carbon tetrachloride; ethers such as tetrahydrofuran and dioxane; esters such as glycol methyl ether acetate, glycol ethyl ether acetate, ethyl acetate and butyl acetate; ketones such as methyl ethyl ketone, methyl isobutyl ketone, cyclohexanone and 4-methyl-4-methoxy-2-pentanone; nitrogen-containing compounds such as dimethyl-formamide, dimethylacetamide, N-methylpyrrolidone and nitrobenzene; and dimethyl sulfoxide. The above solvents may be used singly or in combination.

The method described above can easily give a photosensitive resin having a weight average molecular weight of 40,000 to 200,000. Photosensitive resins having such a high molecular weight have higher photosensitivity than conventional photosensitive resins. The use of photosensitive resins having such a high molecular weight is desirable for the production of the image-forming material of this invention.

The image-forming material of this invention can be prepared by first forming a composition of the photosensitive resin described above in a suitable solvent optionally together with additives such as sensitizers, pigments, dyes, fillers, stabilizers, crosslinking agents and plasticizers, and coating the composition on the surface of a support and then drying it. Suitable solvents differ depending upon the molecular weight and composition of the resin used. Usually, there can be used the same organic solvents as used in the reaction of the polyester precursor with the chain extender; alcohols such as tetrahydrofurfuryl alcohol and benzyl alcohol; alcohol monoalkyl ethers such as glycol monomethyl ether and glycol monoethyl ether; and ethylene glycol monophenyl ether. These solvents may be used singly or in combination.

The sensitizers are those well known in the art, for example benzophenone derivatives, benzanthrone derivatives, quinones, aromatic nitro compounds, naphthothiazoline derivatives, benzothiazoline derivatives, ketocoumarin compounds, pyrylium salts and thiapyrylium salts. Specific examples of the sensitizers include Michler's ketone, diethylaminoethyl benzophenone, benzanthrone, (3-methyl-1,3-diaza-1,9-benz)anthrone picramide, 6,11-dichlorobenzanthrone, 6-phenylbenzanthrone, 1,8-dimethoxyanthraquinone, 1,2-benzanthraquinone, 5-nitroacenaphthene, 2-nitrofluorene, 2,7-dinitrofluorene, 1-nitronaphthalene, 1,5-dinitronaphthalene, p-nitrodiphenyl, 2-dibenzoylmethylene-3-methylnaphthtothiazoline, 2-benzoylmethylene-1-methylnaphthothiazoline, 2-bis(furoyl)methylene-3-methylbenzothiazoline, 2-benzoylmethylene-3-methylbenzothiazoline, 3,3'-carbonylbis(7-diethylaminocoumarin), 2,4,6-triphenylthiapyrylium perchlorate and 2,6-bis(p-ethoxyphenyl)-4-(p-n-amyloxyphenyl)-thiapyrylium perchlorate.

The photosensitive resin composition is coated on a support by known coating methods such as whirler coating, dip coating, curtain coating, roll coating, spray coating, air knife coating, doctor knife coating, and spinner coating.

Specific examples of the support are metal plates such as aluminum, zinc, copper, and stainless steel plates; sheets or plates of synthetic resins such as polyethylene terephthalate, polycarbonate and cellulose derivatives; composite materials such as paper sheets coated with a molten mass or solution of a synthetic resin, and materials obtained by forming a metallic layer on a synthetic resin layer by vacuum deposition, lamination, etc.; and silicon wafers.

As a support of a printing plate, a metallic plate such as an aluminum, copper or zinc plate whose surface has been roughened mechanically, chemically or electrochemically is used, and usually a photosensitive layer having a thickness of 0.1 to 2.5 microns is formed on the metallic plate.

An image may be formed on a printing plate by exposing the photosensitive layer of the printing plate imagewise through a negative, curing and insolubilizing the exposed portions of the photosensitive layer, and developing the unexposed portions with a solvent.

Suitable light sources used for exposure are, for example, a carbon arc lamp, a mercury lamp, a xenon lamp, a metal halide lamp, and a laser beam.

As stated above, the photosensitive image-forming material of this invention is very effective for making a printing plate. The invention, however, is not limited to this particular use and it can also be used in other applications, for example as a photoresist for various fine workings.

The following examples illustrate the present invention more specifically. It should be noted however that the present invention is not limited to these examples unless it departs from the scope of the invention.

EXAMPLES 1 TO 30 AND COMPARATIVE EXAMPLES 1 TO 16

(1) Production of a polyester precursor

Each of the mixtures having the compositions described in columns (a) to (h) of Table 1, 5 g of dibutyltin oxide (catalyst) and 0.25 to 0.5 g of phenothiazine (inhibitor) were fed into a reactor equipped with a stirring device, a nitrogen gas inlet tube, a thermometer and a distillation tube. With stirring under a nitrogen gas atmosphere, the mixture was heated to 180° C. to start the reaction. The mixture was further heated with stirring for 3 hours. When distillation of the resulting ethanol ceased, the pressure of the inside of the reactor was gradually reduced to 1 mmHg at the above temperature. Thereafter, the mixture was further heated with stirring under the reduced pressure for 4 hours. When the distillation of the distillate ceased, the pressure of the inside of the reactor was returned to normal atmospheric pressure with nitrogen gas.

(2) Production of a photosensitive resin

PHotosensitive resins were prepared by the following methods (A) to (G).

Method A

Each of the chain extenders described in Table 2 was added to the polyester precursor (1). The pressure of the inside of the reactor was again adjusted to 1 mmHg. Under this pressure and the conditions shown in Table 2 (temperature in °C./time in hours), the mixture was continuously stirred. Then, the pressure was returned to normal atmospheric pressure, and the resulting resin was withdrawn.

Method B

Monochlorobenzene was added to the polyester precursor (1) to form a 30% by weight solution. Then, each of the chain extenders shown in Table 2 and 1% by weight, based on the polyester precursor, of tetra-n-butyl titanate were fed. The mixture was stirred at 140° C. for 2 hours. Then, the temperature of the inside of the reactor was lowered to room temperature, and the resulting resin solution was withdrawn.

Method C

Each of the chain extenders indicated in Table 2 was added to the polyester precursor (1). Under a nitrogen atmosphere, the mixture was stirred under atmospheric pressure and the reaction conditions (temperature/time) shown in Table 2. Then, the resulting resin solution was withdrawn.

Method D

Monochlorobenzene was added to the polyester precursor (1) to form a 20% by weight solution. Each of the chain extenders shown in Table 2 was charged, and the mixture was stirred at 120° C. for 2 hours in a dark room. Then, the temperature of the inside of the reactor was lowered to room temperature, and the resulting resin solution was withdrawn.

Method E

Monochlorobenzene was added to the polyester precursor (1) to form a 15% by weight solution. Then, each of the chain extenders shown in Table 2 and 200 ppm, based on the polyester precursor, of dibutyltin dilaurate were charged. The mixture was stirred under the conditions shown in Table 2 (temperature/time). Then, the temperature was lowered to 50° C., and a small amount of methanol was added. The mixture was stirred for 30 minutes. The temperature of the inside of the reactor was then lowered to room temperature, and the resulting resin solution was withdrawn.

Method F

Monochlorobenzene was added to the polyester precursor (1). Then, each of the chain extenders shown in Table 2 and 500 ppm, based on the polyester precursor, of dibutyltin dilaurate were charged, and the mixture was stirred at 120° C. for 3 hours. The temperature of the inside of the reactor was lowered to room temperature, and the resulting resin solution was withdrawn.

Method G

Monochlorobenzene was added to the polyester precursor (1) to form a 30% by weight solution. Then, each of the chain extenders shown in Table 2 was charged, and the mixture was stirred under the conditions (temperature/time) shown in Table 2. The temperature of the inside of the reactor was lowered to room temperature, and the resulting resin was withdrawn.

(3) Measurement of the photosensitivity of the photosensitive image-forming material (3)-1: Preparation of a photosensitive plate A solution of 4 g of the resin obtained in (2) in 96 g of monochlorobenzene was prepared, and 0.4 g of 5-nitroacenaphthene and 0.4 g of phthalocyanine pigment were added to prepare a photosensitive composition. The composition was coated by means of a whirler on an anodized aluminum plate, and dried to prepare a photosensitive plate having a photosensitive layer with a thickness of about 1 micron.

(3)-2: Conditions for measuring photosensitivity

A step wedge with a step difference of 0.15 was brought into close contact with the photosensitive plate obtained in (3)-1 above. The photosensitive plate was exposed by means of a 1 kw metal halide lamp ("Idlefin 1000", a product of Iwasaki Electrical Co., Ltd.) at a position 1 m apart from the photosensitive plate for the time shown in Table 2. The photosensitive plate was then developed with a 98:2 by volume mixture of γ-butyrolactone and 85% phosphoric acid, and the highest step number at which the resin was insolubilized was defined as the photosensitivity of the photosensitive plate.

For comparison, an image-forming material was prepared under the same conditions as in the Examples using a resin (having the highest molecular weight obtainable by conventional methods) prepared by reacting each of the polyester precursors used in the Examples for 5 hours further at a reaction temperature of 180° C. under a reaction pressure of 1 mmHg. The photosensitivity of the resulting image-forming material was measured under the same conditions as in the corresponding Example.

The conditions and results of the above Examples and Comparative Examples are summarized in Tables 1 to 3.

The notes asterisked (*1) to (*3) in Table 2 have the following meanings.

(*1): Epiclon B-4400 (a product of Dainippon Ink and Chemicals, Inc.) is a compound of the following formula.

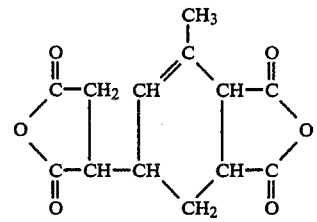

(*2): The amount of the chain extender used is based on total weight of the polyester precursor synthesized from the materials shown in Table 1.

(*3): The equivalents of the functional groups are those of the functional groups of the chain extender capable of reacting with the hydroxyl groups of the polyester precursor per equivalent of these hydroxyl groups.

TABLE 1

| Materials for the polyester precursor | (a) | (b) | (c) | (d) | (e) | (f) | (g) | (h) |
|---|---|---|---|---|---|---|---|---|
| Diethyl p-phenylenediacrylate | 274 g (1 mole) | 274 g (1 mole) | | | 274 g (1 mole) | 274 g (1 mole) | | |
| Diethyl 2-nitro-p-phenylenediacrylate | | | 319 g (1 mole) | | | | 319 g (1 mole) | |
| Diethyl ester of bis(o-cinnamic acid)-diethylene glycol ether | | | | 454 g (1 mole) | | | | 454 g (1 mole) |
| Adduct of bisphenol A (1 mole) and ethylene oxide (2.2 moles) | 137 g (0.4 mole) | | | | | | 137 g (0.4 mole) | |
| Adduct of bisphenol A (1 mole) and ethylene oxide (4.1 moles) | | | 407 g (1 mole) | 407 g (1 mole) | | | | |
| Adduct of bisphenol A (1 mole) and ethylene oxide (6.2 moles) | | | | | 501 g (1 mole) | | | 501 g (1 mole) |
| Adduct of bisphenol A (1 mole) and ethylene oxide (10 moles) | 401 g (0.6 mole) | | | | | | 401 g (0.6 mole) | |
| Polyethylene glycol (molecular weight 300) | | 180 g (0.6 mole) | | | | 180 g (0.6 mole) | | |
| Tricyclodecane dimethanol | | 79 g (0.4 mole) | | | | 79 g (0.4 mole) | | |
| Ethylene glycol | 32 g (0.5 mole) | 32 g (0.5 mole) | 32 g (0.5 mole) | 32 g (0.5 mole) | 64 g (1 mole) | 64 g (1 mole) | 64 g (1 mole) | 64 g (1 mole) |
| Weight average molecular weight of the resulting polyester precursor | 33,000 | 29,500 | 15,600 | 22,000 | 31,500 | 29,500 | 14,900 | 26,300 |

TABLE 2

| Example No. | | Chain extender | Amount of the chain extender used (g) (*2) | Kind of the polyester precursor | Chain extension | | Equivalents of the functional groups (*3) | Weight average molecular weight of the resulting photosensitive resin | Photosensitivity | | Corresponding comparative Example No. |
|---|---|---|---|---|---|---|---|---|---|---|---|
| | | | | | Method | Conditions (temperature, °C./time, hrs) | | | Exposure time (seconds) | Number of steps for insolubilization | |
| 1 | Diaryl phthalate compound | Diphenyl terephthalate | 23 | (a) | A | 180° C./0.5 | 0.85 | 54,000 | 30 | 15 | 1 |
| 2 | | " | 22 | (b) | " | 180° C./0.5 | 1.12 | 51,200 | " | 14 | 2 |
| 3 | | " | 32 | (c) | " | 180° C./0.5 | 1.08 | 49,500 | " | 14 | 3 |
| 4 | | " | 15 | (a) | " | 180° C./0.5 | 1.14 | 51,000 | " | 14 | 1 |
| 5 | Diphenyl carbonate compound | Diphenyl carbonate | 35 | (d) | " | 180° C./0.5 | 1.46 | 57,300 | " | 13 | 4 |
| 6 | Diphenyl oxalate compound | Diphenyl oxalate | 25 | (a) | C | 180° C./0.33 | 0.83 | 53,600 | " | 15 | 1 |
| 7 | Bis(N—acyllactam) compound | Terephthaloyl bis(N—caprolactam) | 25 | (b) | B | 140° C./2 | 1.14 | 52,900 | " | 14 | 2 |
| 8 | | " | 36 | (c) | C | 180° C./0.33 | 1.09 | 49,100 | " | 13 | 3 |
| 9 | | Sebacoyl bis(N—caprolactam) | 27 | (a) | " | 180° C./0.33 | 0.81 | 48,600 | " | 14 | 1 |
| 10 | Bis(N—acylimide) compound | Adipoyl bis(N—succinimide) | 40 | (d) | B | 140° C./2 | 1.31 | 56,800 | " | 12–13 | 4 |
| 11 | Tetracarboxylic dianhydride | Pyromellitic dianhydride | 20 | (e) | D | 120° C./2 | 1.07 | 83,200 | 15 | 14 | 5 |
| 12 | | " | 20 | (f) | " | 120° C./2 | 1.48 | 77,600 | " | 13 | 6 |
| 13 | | " | 15 | (h) | " | 120° C./2 | 0.64 | 73,900 | " | 12 | 8 |
| 14 | | Epicion B-4400 (*1) | 24 | (e) | " | 120° C./2 | 1.06 | 81,600 | " | 13 | 5 |
| 15 | | 3,3',4,4'-Benzophenone-tetra-carboxylic dianhydride | 55 | (g) | " | 120° C./2 | 1.45 | 69,500 | " | 13 | 7 |
| 16 | bis-Benzoxazinone compound | 6,6'-Methylenbis (2-methyl-4H,31-benzoxadin-4-one) | 23 | (a) | G | 140° C./3 | 0.81 | 51,800 | 30 | 15 | 1 |
| 17 | | 6,6'-Methylenbis (2-methyl-4H,31-benzoxadin-4-one) | 23 | (b) | C | 180° C./1.5 | 1.12 | 53,400 | " | 14 | 2 |
| 18 | | 6,6'-Methylenbis (2-methyl-4H,31-benzoxadin-4-one) | 33 | (c) | G | 140° C./3 | 1.06 | 50,500 | " | 13 | 3 |
| 19 | | 6,6'-Methyllenbis(2-phenyl-4H,3,6-benzoxadin-4-one | 32 | (a) | " | 140° C./3 | 0.83 | 49,500 | " | 14 | 1 |
| 20 | | 2,8-Dimethyl-4H,6H—benzo[1,2-d:5,4-d'] bis[1,3]-oxadine-4,6-dione | 32 | (d) | C | 180° C./1.5 | 1.31 | 57,300 | " | 13 | 4 |
| 21 | Polyisocyanate compound | 2,4-Tolylene diisocyanate | 14.7 | (a) | E | 60° C./4 | 1 | 125,000 | 7.5 | 14 | 9 |
| 22 | | " | 8.6 | (b) | " | 60° C./4 | 0.8 | 132,000 | " | 14 | 10 |
| 23 | | " | 19.5 | (c) | " | 60° C./3 | 1.2 | 119,000 | " | 13 | 11 |
| 24 | | Isophorone diisocyanate | 18.8 | (a) | " | 70° C./4 | 1 | 113,000 | " | 13 | 9 |
| 25 | | 2,4-Tolylene diisocyanate blocked with phenol | 36.0 | (d) | " | 140° C./1 | 1 | 128,000 | " | 12 | 12 |
| 26 | bis-Oxazolone compound | 2,2'-p-Phenylenebis[(4methyl(4H) oxazolone-5] | 23.0 | (a) | F | 120° C./3 | 1 | 96,800 | 15 | 14 | 13 |
| 27 | | 2,2'-p-Phenylenebis[4-methyl(4H) oxazolone-5] | 13.4 | (b) | " | 120° C./3 | 0.8 | 86,000 | " | 13 | 14 |
| 28 | | 2,2'-p-Phenylenebis[4-methyl(4H) oxazolone-5] | 30.5 | (c) | " | 120° C./3 | 1.2 | 88,100 | " | 12 | 15 |
| 29 | | 2,2'-m-phenylenebis[(4H)oxozolone-5] | 20.7 | (a) | " | 120° C./3 | 1 | 98,500 | " | 10–11 | 13 |
| 30 | | 2,2'-Tetramethylenebis[4,4-dimethyl-(4H)oxazolone-5] | 27.8 | (d) | " | 120° C./3 | 1 | 101,900 | " | 12 | 16 |

TABLE 3

| Comparative Example No. | Kind of the polyester precursor used | Weight average molecular weight of the resulting photosensitive resin | Photosensitivity Exposure time (seconds) | Photosensitivity Number of steps for insolubilization |
|---|---|---|---|---|
| 1 | (a) | 39,000 | 30 | 12–13 |
| 2 | (b) | 37,400 | " | 12 |
| 3 | (c) | 28,500 | " | 10 |
| 4 | (d) | 32,500 | " | 11 |
| 5 | (e) | 37,000 | 15 | 10 |
| 6 | (f) | 35,000 | " | 9–10 |
| 7 | (g) | 28,000 | " | 8 |
| 8 | (h) | 33,000 | " | 9 |
| 9 | (a) | 39,000 | 7.5 | 8–9 |
| 10 | (b) | 37,400 | " | 8 |
| 11 | (c) | 28,500 | " | 6 |
| 12 | (d) | 32,500 | " | 7 |
| 13 | (a) | 39,000 | 15 | 10–11 |
| 14 | (b) | 37,400 | " | 10 |
| 15 | (c) | 28,500 | " | 8 |
| 16 | (d) | 32,500 | " | 9 |

It is seen from a comparison of Table 2 with Table 3 that the weight average molecular weights of the photosensitive resins of the Examples obtained by reacting the polyester precursors with the chain extenders are about 50,000 to 130,000, whereas those of the photosensitive resins of the Comparative Examples whose molecular weights were increased as much as possible by performing the polyester-forming reaction for a long period of time without using any chain extender are about 30,000 to 40,000.

The photosensitive resins used to produce the image-forming materials of this invention have higher weight average molecular weights than conventional photosensitive resins, and consequently the photosensitivities of the image-forming materials of the Examples (the invention) are higher under the same exposure conditions than those of the image-forming materials obtained by the Comparative Examples (the prior art) by 1.5 to 8 steps as the insolubilization steps.

What is claimed is:

1. A photosensitive image-forming material having a photosensitive layer, said photosensitive layer comprising a photosensitive resin which is the reaction product of a hydroxyl-containing polyester precursor composed of dicarboxylic acid units derived from a dicarboxylic acid having a photosensitive unsaturated double bond adjacent to an aromatic ring and glycol units with a chain extender having in the molecule at least two functional groups reactive with the hydroxyl groups of the polyester precursor, said photosensitive resin having a weight average molecular weight of at least 40,000.

2. The image-forming material of claim 1 wherein the dicarboxylic acid units derived from a dicarboxylic acid having a photosensitive unsaturated double bond adjacent to an aromatic ring are represented by any of the following general formulae (1) to (7):

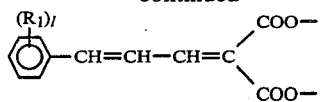

(1)

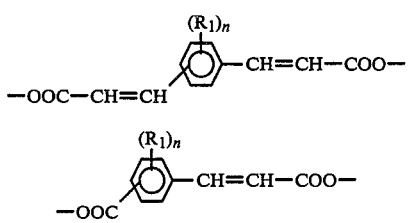

(2)

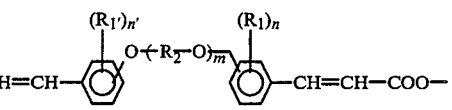

(3)

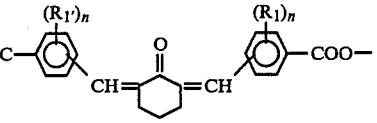

(4)

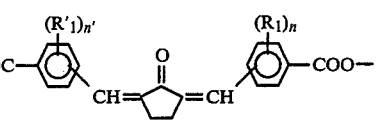

(5)

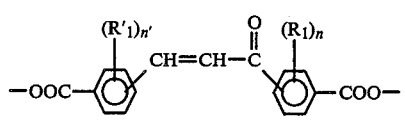

(6)

(7)

wherein $R_1$ and $R'_1$, independently from each other, represent a hydrogen atom, an alkyl group having 1 to 4 carbon atoms, an alkoxy group having 1 to 4 carbon atoms, a halogen atom or a nitro group, $R_2$ represents an alkylene group having 2 to 4 carbon atoms, $l$ represents an integer of 1 to 5, n represents an integer of 1 to 4, and m represents an integer of 1 to 5.

3. The image-forming material of claim 1 or 2 wherein the chain extender contains as the functional groups capable of reacting with the hydroxyl groups of the polyester precursor at least one kind of functional groups selected from the class consisting of aryl ester, aryl carbonate, N-acyllactam, N-acylimide, acid anhydride, benzoxazinone, isocyanate, blocking isocyanate, oxazolonyl, N-acylimidazole, silanol, furoxane, aziridine, isothiocyanate, vinyl ether, ketene acetal, unsaturated cycloacetal and carbodiimide groups.

4. The image-forming material of any one of claims 1 or 2 wherein the chain extender is at least one compound selected from the group consisting of diaryl oxalate compounds, diaryl phthalate compounds, diaryl carbonate compounds, bis(N-acyllactam) compounds, bis(N-acylimide) compounds, tetracarboxylic dianhydrides, bisbenzoxazinone compounds, polyisocyanate compounds, bisoxazolone compounds, bis(N-acylimidazole) compounds, alkoxysilane compounds, silanol compounds, furoxane compounds, bisaziridine compounds, polyisothiocyanate compounds, divinyl ether compounds, diketene acetal compounds, unsaturated cycloacetal compounds and biscarbodiimide compounds.

5. The image-forming material of claim 1 wherein the amount of the dicarboxylic acid units derived from a dicarboxylic acid having a photosensitive unsaturated double bond adjacent to an aromatic ring is 30 to 100 mole% based on the total amount of the dicarboxylic acid units.

6. The image-forming material of claim 1 wherein the polyester precursor contains a hydroxyl group at both ends of the molecule, and has a weight average molecular weight of at least 7,000.

7. The image-forming material of claim 1 wherein the photosensitive resin has a weight average molecular weight of up to 200,000.

8. The image-forming material of claim 1 wherein the photosensitive layer is coated on a support having a roughened metallic surface, and is useful as a printing plate.

9. The image-forming material of claim 1 wherein the photosensitive resin has a weight average molecular weight of from about 50,000 to 130,000.

10. The image-forming material of claim 1 wherein the photosensitive layer has a thickness of 0.1 to 2.5 microns.

11. The image-forming material of claim 8 wherein the photosensitive layer has a thickness of 0.1 to 2.5 microns.

12. The image-forming material of claim 1 wherein the chain extender is a polyisocyanate compound.

13. The image-forming material of claim 12 wherein the polyisocyanate compound is selected from the group consisting of aromatic diisocyanate compounds, aliphatic diisocyanate compounds, alicyclic diisocyanate compounds, reaction products of polyols and diisocyanates, diisocyanate polymers, and block polyisocyanate compounds.

14. The image-forming material of claim 13 wherein the polyisocyanate compound is selected from the group consisting of 2,4-tolylene diisocyanate, 2,6-tolylene diisocyanate, xylylene diisocyanate, m-xylylene diisocyanate, 4,4'-diphenylmethane diisocyanate, naphthylene diisocyanate, hexamethylene diisocyanate, trimethylhexamethylene diisocyanate, lysine diisocyanate, dimeric acid diisocyanate, isophorone diisocyanate, 4,4'-methylenebis-(cyclohexyl isocyanate), methylcyclohexane-2,4-diisocyanate, methylcyclohexane-2,4,6 diisocyanate, 1,3-(isocyanate methyl)cyclohexane, an adduct of 1 mole of 1,3-butylene glycol and 2 moles of tolylene diisocyanate, an adduct of 1 mole of trimethylolpropane and 3 moles of tolylene diisocyanate, hexamethylene diisocyanate trimer, tolylene diisocyanate trimer, and blocked isocyanate compounds obtained by reacting any of the foregoing polyisocyanate compounds with a blocking agent selected from the group consisting of alcohols, phenols, lactams, oximes, and active methylene compounds.

* * * * *